(12) United States Patent
Roy et al.

(10) Patent No.: US 7,791,970 B2
(45) Date of Patent: Sep. 7, 2010

(54) BIASED SENSING MODULE

(75) Inventors: Tanmoy Roy, Noida (IN); Nasim Ahmad, Delhi (IN)

(73) Assignee: STMicroelectronics Pvt. Ltd., Greater Noida, Uttar Pradesh (IN)

( * ) Notice: Subject to any disclaimer, the term of this patent is extended or adjusted under 35 U.S.C. 154(b) by 213 days.

(21) Appl. No.: 11/856,801

(22) Filed: Sep. 18, 2007

(65) Prior Publication Data

US 2008/0212354 A1    Sep. 4, 2008

(30) Foreign Application Priority Data

Sep. 18, 2006    (IN) .................. 2059/DEL/2006

(51) Int. Cl.
*G11C 7/10*    (2006.01)
(52) U.S. Cl. .................. 365/203; 365/205; 365/189.02
(58) Field of Classification Search .................. 365/203, 365/205, 189.02
See application file for complete search history.

(56) References Cited

U.S. PATENT DOCUMENTS

| | | | | |
|---|---|---|---|---|
| 5,461,713 A * | 10/1995 | Pascucci | .................. | 365/203 |
| 5,511,026 A * | 4/1996 | Cleveland et al. | .................. | 365/189.09 |
| 6,327,202 B1 * | 12/2001 | Roohparvar | .................. | 365/203 |
| 6,462,998 B1 * | 10/2002 | Proebsting | .................. | 365/205 |
| 2007/0097768 A1 * | 5/2007 | Barth | .................. | 365/208 |

* cited by examiner

*Primary Examiner*—Tuan T. Nguyen
(74) *Attorney, Agent, or Firm*—Lisa K. Jorgenson; Allen, Dyer, Doppelt, Milbrath & Gilchrist, P.A.

(57) ABSTRACT

A circuit includes a first pre-charge module, a first multiplexer module, a second pre-charge module, a second multiplexer module, a sense amplifier circuit, a third pre-charge module, an output module. The circuit is operatively coupled to a first core block and a second core block to provide the desired matching characteristics. The first core block and the second core block are memory blocks used for storing data bits for read-write operations. The circuit utilizes a unique operational coupling with one of the core blocks to provide the matching characteristics.

19 Claims, 4 Drawing Sheets

BIASED SENSING MODULE

FIELD OF THE INVENTION

The present invention relates to sensing schemes for non-differential signals, and more specifically, to a biased sensing scheme for enhancing matching characteristics with an improved response time.

BACKGROUND OF THE INVENTION

A differential amplifier circuit is used to compare two signals for detecting a differential signal or to offset the noise of two simultaneously input signals, and is a circuit used in electronic devices. A balanced differential amplifier employs a need based strategy of matching the two branches of the differential pair (desire is to have minimum offset). In the case of balanced differential amplifier, noise that is generated due to high capacitances is cancelled out. In conventional unbalanced difference amplifiers, one of the differential input nodes is coupled to a reference node and the other is coupled to a signal source. The reference may not be in synchronization with the actual charge feeding or sinking of the branch coupled to the signal source. This creates additional offset over and above the offset introduced by asymmetric devices. Thus, a conventional unbalanced amplifier may be highly susceptible to failures due to mismatches between the differential branches feeding it.

FIG. 1 illustrates a circuit diagram 100 of a conventional biasing circuit. The circuit 100 includes a core block 102, pre-charge modules, such as 104A, 104B and 104C, a multiplexer module 106, a latch circuit 108, and two PMOS pass transistors 110 and 112 coupled to the latch nodes SAT and SAF. In one embodiment, the core block 102 can be a NAND block, where input non-differential signals are allowed to enter a branch. The pre-charge modules 104A, 104B and 104C include PMOS transistors. The latch circuit 108 includes two PMOS transistors 114 and 116 and two NMOS transistors 118 and 120. The transistors 114 and 118 and the transistors 116 and 120 are individually coupled to form two inverters.

The two inverters are cross coupled to form the latch circuit 108. A pull down transistor 122 is coupled to the latch circuit 108. A drain terminal of the pull down transistor 122 is coupled to the source terminals of the NMOS transistors 118 and 120 and the source terminal is coupled to a ground terminal. The gate terminal is controlled by a control signal SON. A source terminal of the PMOS pass transistor 110 is coupled to a node NET A, a drain terminal is coupled to a latch output node SAT, and the gate terminal is controlled by the control signal SON. A source terminal of the PMOS pass transistor 112 is coupled to a node NET B, a drain terminal is coupled to a latch output node SAF, and the gate terminal is controlled by the control signal SON.

A non-differential input signal may enter the branch, when a clock signal CK is enabled. The non-differential input signal is multiplexed and is passed onto the latch output node SAT through the PMOS transistor 110. A reference signal is given to the latch output node SAF through the PMOS transistor 112. The non-differential signals are read in three phases. First, the branches, the reference line and latch output nodes SAT and SAF are pre-charged before a read or resolving cycle. Second, when the control signal CK is enabled, the pre-charge circuits are turned off, as their inputs go high. However, the reference pre-charge will not be turned off. It is in an on state. One of multiplexer pass transistors is turned on (i.e., its input turns low) depending on the multiplexer address, and the input signal gets coupled to the latch output node SAT or SAF. A control signal SON is turned high and the pull down transistor is turned on and latch output nodes are decoupled from the external signal. The sense amplifier resolves the initial difference created between SAT and SAF.

However, due to the inherent mismatch in the devices coupled to the differential branches, the conventional method presents several problems at different stages of manufacturing as well as in the circuitry or architecture, where the non-differential amplifier is employed. It suffers from active and poly masking problems like STI (Shallow Trench Isolation) matching, mask misalignment, doping gradient and poly shadowing. It suffers from device level problems like large figure size, gate/drain/metal capacitance mismatches and physical effects like individual signal and supply capacitance differences, charge feed through internal node capacitance, and pass transistor shared node capacitance differences between the differential nodes.

Therefore, there is a need for a sensing scheme for a low swing non-differential signal with a low input referred offset, so that the robustness of the system is improved.

SUMMARY OF THE INVENTION

It is an object of the present invention to provide a biased sensing circuit for sensing non-differential signals with enhanced matching characteristics. It is another object to provide a biased sensing circuit with an improved response time.

To achieve the aforementioned objectives, one aspect provides a biased sensing circuit for sensing non-differential signals comprising a first pre-charge module operatively coupled to a first core block for charging, and a first multiplexer module operatively coupled between the first pre-charge module and a first pass transistor. A second pre-charge module may be operatively coupled to a second core block for charging, and a second multiplexer module may be operatively coupled between the second pre-charge module and a second pass transistor. A sense amplifier circuit may be operatively coupled between the first multiplexer module and the second multiplexer module for receiving differential inputs through the first pass transistor and the second pass transistor to provide an output. A third pre-charge module may be operatively coupled to the differential inputs of the sense amplifier circuit, and an output module operatively may be coupled to the sense amplifier for providing an output signal.

There may be a sense amplifier circuit comprising a latch circuit having a first inverter circuit cross-coupled to a second inverter circuit, a first pull down transistor operatively coupled to latch circuit for receiving a first control signal, a first pass transistor operatively coupled to the first inverter circuit, and a second pass transistor is operatively coupled to the second inverter circuit. A second pull down transistor operatively coupled to the first pass transistor and the second pass transistor for receiving a second control signal.

Furthermore, a read only memory (ROM) comprises a plurality of memory blocks for storing data bits and a biased sensing circuit coupled to the plurality of memory blocks for providing enhanced matching characteristics. The biased sensing circuit may comprise a first pre-charge module operatively coupled to a first core block for charging, a first multiplexer module operatively coupled between the first pre-charge module and a first pass transistor, and a second pre-charge module operatively coupled to a second core block for charging. A second multiplexer module may be operatively coupled between the second pre-charge module and a second pass transistor. A sense amplifier circuit may be operatively coupled between the first multiplexer module and the second multiplexer module for receiving differential inputs through the first pass transistor and the second pass transistor to provide an output. A third pre-charge module may be operatively coupled to the differential inputs of the sense amplifier circuit, and an output module may be operatively coupled to the sense amplifier for providing an output signal.

Another aspect is directed to a method of sensing non-differential signals through a biased sensing circuit. The method may comprise precharging input nodes, output nodes and sensing branches of the biased sensing circuit, selecting one of a first core block and a second core block through a selection line, applying a clock signal to turn off pre-charge modules to conduct through a selected multiplexer module for allowing an input signal to enter into one of the first core block and the second core block. The method may also include inverting the input signal, when the input signal enters in the second core block, and multiplexing the output lines with a select signal, when the input signal does not enter in the second core block.

DETAILED DESCRIPTION OF THE PREFERRED EMBODIMENTS

Figure 1:
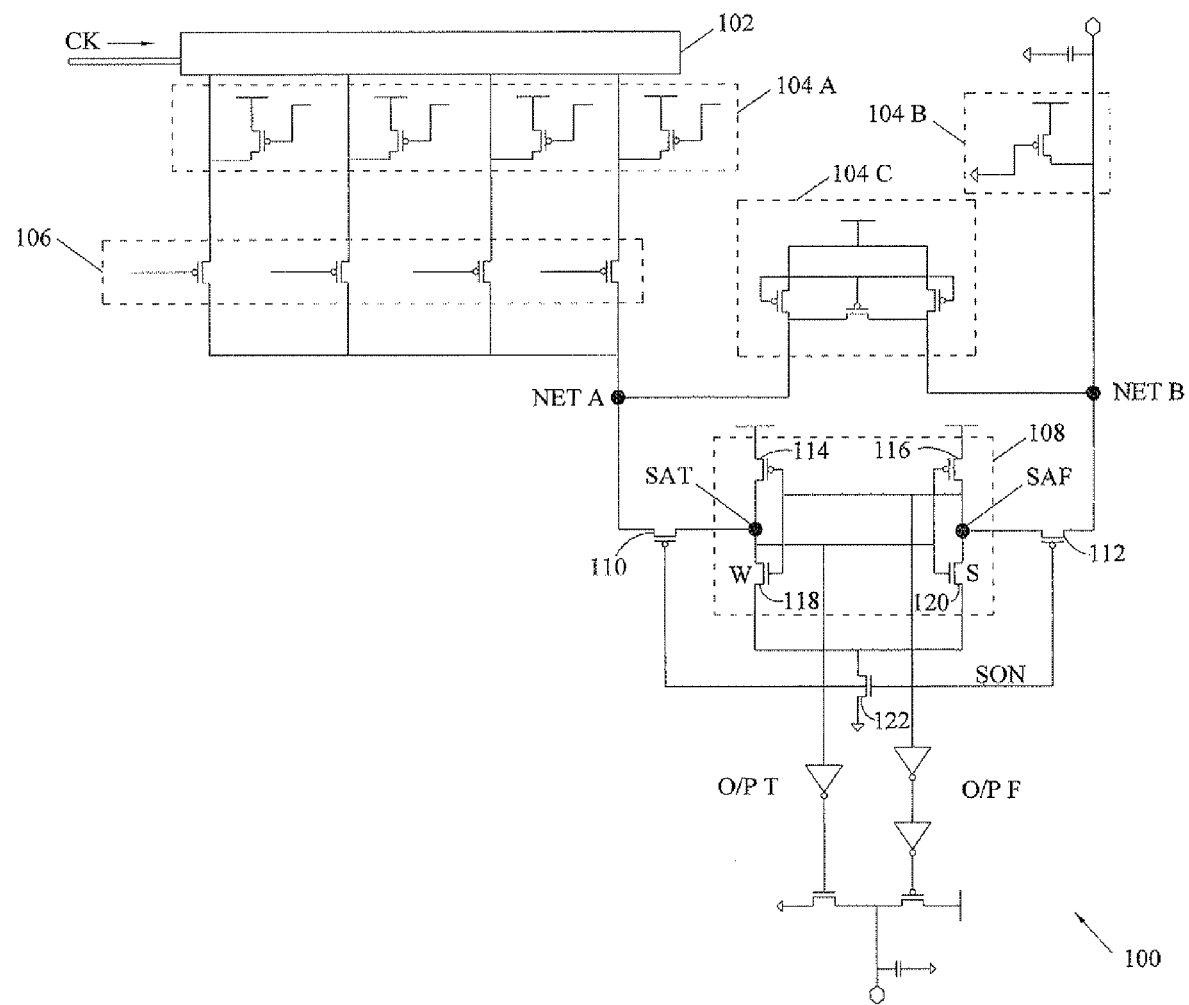
FIG. 1 illustrates a circuit diagram of a biased sensing scheme, in accordance with the prior art.

The preferred embodiments of the present invention will be described in detail with reference to the accompanying drawings. However, the present invention is not limited to the preferred embodiments. The present invention can be modified in various forms. The preferred embodiments of the present invention are only provided to explain more clearly the present invention to the ordinarily skilled in the art of the present invention. In the accompanying drawings, like reference numerals are used to indicate like components.

One aspect provides a biased sensing module for minimizing the mismatch with an enhanced response time.

Figure 2:
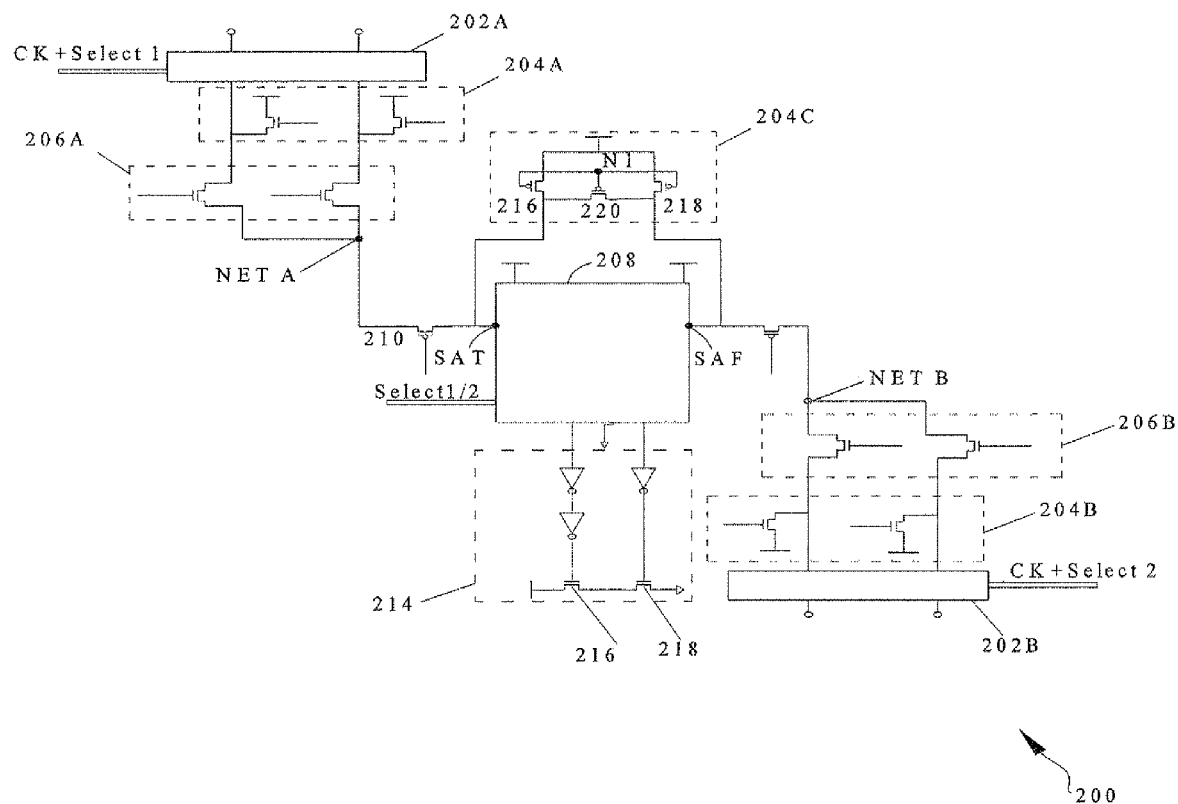
FIG. 2 illustrates a circuit diagram of a biased sensing scheme according to the present invention.

FIG. 2 illustrates a circuit diagram 200 of a biased sensing circuit. The circuit 200 includes a first core block 202A, a second core block 202B, a first pre-charge module 204A, a second pre-charge module 204B, a third pre-charge module 204C, a first multiplexer module 206A, a second multiplexer module 206B, a sense amplifier circuit 208, a first PMOS transistor 210, a second PMOS transistor 212 and an output module 214.

The first core block 202A and the second core block 202B are NAND blocks, where input non-differential signals are allowed to enter. The first core block 202A is coupled to the pre-charge module 204A. The first pre-charge module 204A is coupled to the first multiplexer module 206A. The first multiplexer module 206A is coupled to the first PMOS transistor 210 through a node NET A. The second core block 202B is coupled to the second pre-charge module 204B. The second pre-charge module 204B is coupled to the second multiplexer module 206B. The second multiplexer module 206B is coupled to the second PMOS transistor 212 through a node NET B. The third pre-charge module 204C is coupled to sensing branches SAT and SAF of the sense amplifier circuit 208.

The third pre-charge module 204C comprises three PMOS transistors 216, 218 and 220. A source terminal of the PMOS transistor 216 is coupled to a voltage source, a drain terminal is coupled to the sensing branch SAT of the sense amplifier circuit 208, and a gate terminal is coupled to a node N1. A source terminal of the PMOS transistor 218 is coupled to the voltage source, a drain terminal is coupled to the sensing branch SAF of the sense amplifier circuit 208 and a gate terminal is coupled to the gate terminal of the PMOS transistor 216 through the node N1. A source terminal of the PMOS transistor 220 is coupled to the drain terminal of the PMOS transistor 218, a drain terminal is coupled to the drain terminal of the PMOS transistor 216, and a gate terminal is coupled to the gate of the PMOS transistor 216 and the PMOS transistor 218 through the node N1.

The output module 214 comprises multiplexed output lines. An output from the true sensing branch (SAT) of the sense amplifier circuit 208 is given to one output line. Two NOT gates are coupled to the output line. An output from the false sensing branch (SAF) of the sense amplifier circuit 208 is given to another output line. The two output lines are multiplexed using a PMOS transistor 218 and an NMOS transistor 216 to provide an output.

The non-differential multiplexed signals have been split into a first core block 202A and a second core block 202B. Before the start of the cycle nodes SAT, SAF, NETA, NETB and the input lines are pre-charged. Before the arrival of a clock signal CK, selection of the core block is made by select lines, which also change the bias (on which side, i.e., SAT or SAF, the weaker pull down is to be coupled in the sense amplifier circuit 208).

At the arrival of clock signal CK, the pre-charge modules are turned off, and selected multiplexer pass transistor is turned on irrespective of their coupling to the SAT or SAF branch. This is done in order to ensure similar (miller or parasitic) charge feeding or sinking at the differential nodes, both before and after sense pass transistors 210 and 212. An input referred offset from the input branches has now been nullified.

Figure 3:
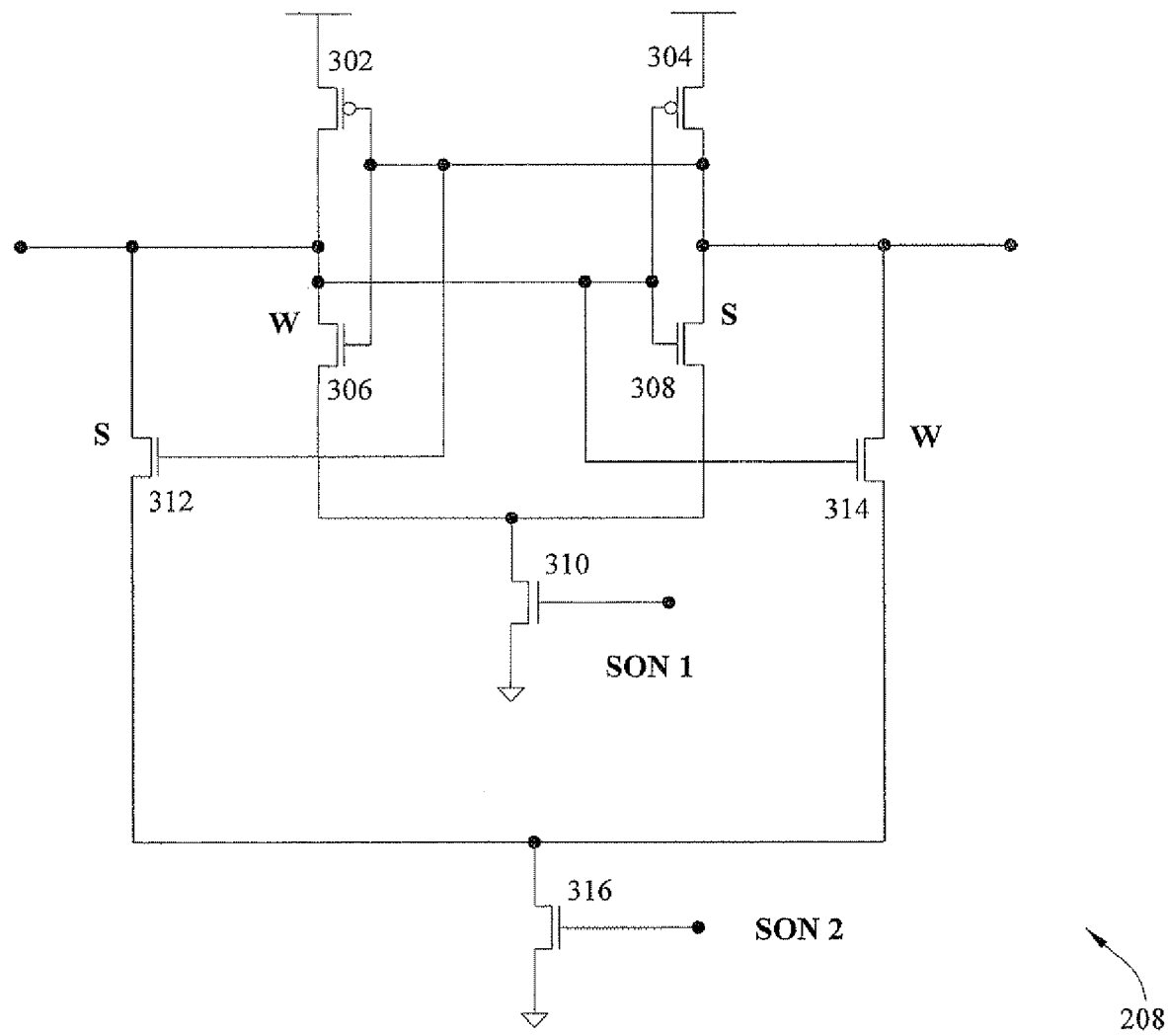
FIG. 3 illustrates a circuit diagram of a sense amplifier according to the present invention.

FIG. 3 illustrates a circuit diagram of a sense amplifier circuit 208. The circuit 208 includes two PMOS transistors 302 and 304 and two NMOS transistors 306 and 308. The NMOS transistor 306 is a weak transistor compared to the NMOS transistor 308. The transistors 302 and 306 and the transistors 304 and 308 are individually coupled to form two inverters. The two inverters are cross-coupled to form a latch circuit. A pull down transistor 310 is coupled to the latch. A drain terminal of the pull down transistor 310 is coupled to the source terminals of the NMOS transistors 306 and 308 and the source terminal is coupled to a ground voltage level. The gate terminal is controlled by a control signal SON1. Two NMOS transistors 312 and 314 are coupled to the latch circuit. A drain terminal of the NMOS transistor 312 is coupled to a latch output node N2 and the source terminal is coupled to a drain terminal of a pull down transistor 316. A gate terminal of the transistor 312 is coupled to the gate terminals of the transistors 302 and 306. The gate terminal of the transistor 312 is also coupled to the drain terminal of the PMOS transistor 304 and to the drain terminal of the NMOS transistor 308. A drain terminal of the NMOS transistor 314 is coupled to a latch output node N3 and the source terminal is coupled to a drain terminal of a pull down transistor 316. A gate terminal of the transistor 314 is coupled to the gate terminals of the transistors 304 and 308. The gate terminal of the transistor 314 is also coupled to the drain terminal of the PMOS transistor 302 and to the drain terminal of the NMOS transistor 306. The transistor 312 is a strong transistor as compared to the transistor 314. A source terminal of the pull down transistor 316 is coupled to the ground voltage level and a gate terminal is controlled by a control signal SON2.

The two control signals SON1 and SON2, depending on which multiplexer portion is to be selected, are used to select the bias created by the weak transistor 306 or 314 on one side and the strong transistor 308 or 312 at the other. If a control signal Select1 is applied, the first core block 202A may be selected and the control signal SON1 may be enabled and the signal at the SAT branch will be resolved. If a control signal Select2 is applied, the second core block 202B may be selected and the control signal SON2 may be enabled and the signal at the SAF branch may be resolved. The sense may be perfectly balanced in terms of the load and capacitive coupling at the two differential branches.

If an input from an upper or lower portion is to be read (depends on select signal Select1 or Select2) after the differential voltage development phase, control signals Son1 or Son2 goes high, so that the side being read is pulled down slower as compared to the other side. The voltage difference for a read-0 (bit line discharge) may be sufficient enough to offset this difference in transistor strengths for correct read-0 operation (read-1 operation is favored by the bias).

No differentiation is done at the multiplexer pass transistor level on whether a signal from the branch coupled to SAT or SAF is to be resolved, but the differentiation is shifted to two different levels. First, inside the sense amplifier circuit 208, where the select signal decides whether a signal at the SAT branch may be resolved or a signal at the SAF branch has to be resolved. Second, at the core block level, where the select signal is mixed with the clock signal CK, is decided whether the signal from the branch coupled to SAT or SAF should be allowed to enter.

The input signals on the second core block 202B are inverted. This has to be done if an input from the lower half is to be resolved, a low swing on that input should swing the sense in the same direction as that if a low swing on an input from upper half is to be resolved.

The above method may not be possible in some applications. Then another approach is to multiplex the output lines with the select signal through the output module 214.

Figure 4:
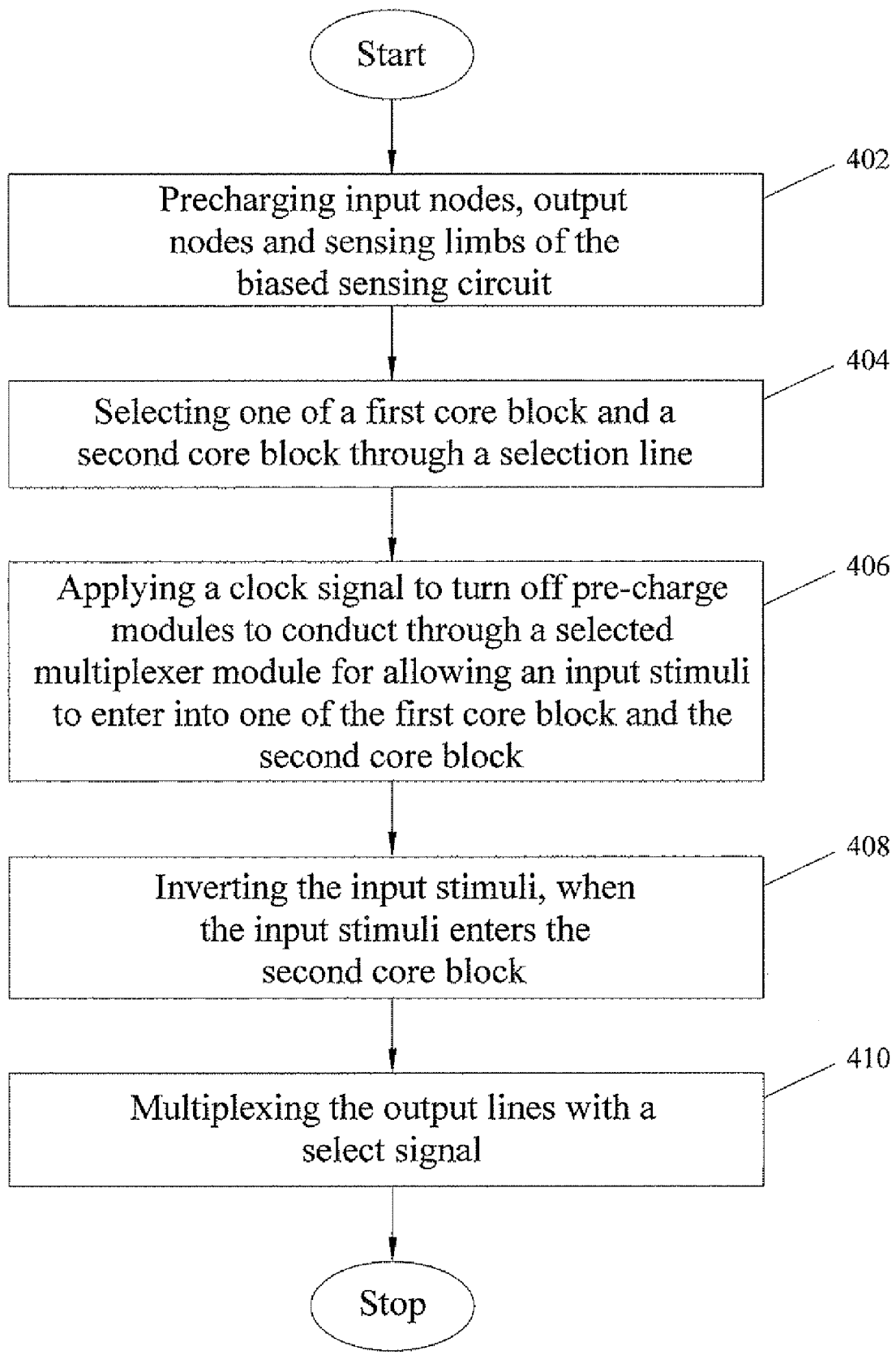
FIG. 4 illustrates a flow diagram of a method for sensing non-differential signals for providing minimum mismatching according to the present invention.

FIG. 4 illustrates a flow diagram of a method for sensing non-differential signals with minimized mismatch. At step 402, input nodes, output nodes and sensing branches of the biased sensing circuit are pre-charged. At step 404, one of a first core block and a second core block is selected through a selection line. At step 406 a clock signal is applied to turn off pre-charge modules to conduct through a selected multiplexer module for allowing input signals to enter into one of the first core block and the second core block. At step 408, the input signals are inverted, when the input signals enter the second core block. At step 410, the output lines are multiplexed with a select signal.

These devices and methods offer many advantages. First, robustness of the system is improved as the input referred offset is very low. Second, the speed is increased as a lower voltage difference has now to be ensured which is attributed to a lower input referred offset. The increase in speed is further attributed to a lower capacitance due to a split multiplexer circuit. Third, there is reduction in power as the input lines reduce the swing to detect a zero. Fourth, the effort in making a layout is reduced as the structure is now fully differential. Fifth, a reduction in area as the reference branch has been managed.

Although the disclosure of system and method has been described in connection with the embodiments of the present invention illustrated in the accompanying drawings, they are not limited thereto. It will be apparent to those skilled in the art that various substitutions, modifications and changes may be made thereto without departing from the scope and spirit of the disclosure.

That which is claimed:

1. A sensing circuit comprising:
a first pre-charge module and a first core block coupled thereto;
a first pass transistor;
a first multiplexer module coupled between said first pre-charge module and said first pass transistor;
a second pre-charge module and a second core block coupled thereto;
a second pass transistor;
a second multiplexer module coupled between said second pre-charge module and said second pass transistor;
a sense amplifier circuit coupled between said first multiplexer module and said second multiplexer module and having first and second inputs to receive inputs through said first pass transistor and said second pass transistor, respectively; and
a third pre-charge module coupled to said first and second inputs of said sense amplifier circuit.

2. The sensing circuit of claim 1, further comprising an output module coupled to said sense amplifier and to provide an output signal.

3. The sensing circuit of claim 1, wherein said first pre-charge module comprises at least one NMOS transistor.

4. The sensing circuit of claim 1, wherein said second pre-charge module comprises at least one NMOS transistor.

5. The sensing circuit of claim 1, wherein said first pass transistor comprises a PMOS transistor.

6. The sensing circuit of claim 1, wherein said second pass transistor comprises a PMOS transistor.

7. The sensing circuit of claim 1, wherein said third pre-charge module comprises:
a third pass transistor having a source terminal coupled to a voltage source, a drain terminal coupled to said first input of said sense amplifier, and a gate terminal coupled to a node;
a fourth pass transistor having a source terminal coupled to said voltage source, a drain terminal coupled to the second input of the sense amplifier, and a gate terminal coupled to the gate terminal of the third pass transistor through the node; and
a fifth pass transistor having a source terminal coupled to the drain terminal of the fourth pass transistor, a drain terminal coupled to the drain terminal of the third transistor, and a gate terminal coupled to the gate of the third pass transistor and the fourth pass transistor through said node.

8. The sensing circuit of claim 7, wherein said third pass transistor comprises a PMOS transistor.

9. The sensing circuit of claim 7, wherein said fourth pass transistor comprises a PMOS transistor.

10. The circuit of claim 7, wherein said fifth pass transistor comprises a PMOS transistor.

11. A read only memory (ROM) comprising:
a plurality of memory blocks for storing data bits; and
a biased sensing circuit coupled to said plurality of memory blocks comprising:
a first pre-charge module and a first core block coupled thereto,
a first pass transistor, a first multiplexer module coupled between said first pre-charge module and said first pass transistor, a second pre-charge module and a second core block coupled thereto, a second pass transistor, a second multiplexer module coupled between the second pre-charge module and said second pass transistor, a sense amplifier circuit coupled between said first multiplexer module and said second multiplexer module and having first and second inputs to receive inputs through said first pass transistor and said second pass transistor, respectively, and a third pre-charge module coupled to said first and second inputs of said sense amplifier circuit.

12. The ROM of claim 11, wherein said biased sensing circuit further comprises an output module coupled to said sense amplifier to provide an output signal.

13. The ROM of claim 11, wherein said first pre-charge module comprises at least one NMOS transistor; and wherein said second pre-charge module comprises at least one NMOS transistor.

14. The ROM of claim 11, wherein said first pass transistor comprises a NMOS transistor; and wherein said second pass transistor comprises a NMOS transistor.

15. The ROM of claim 11, wherein said third pre-charge module comprises:

a third pass transistor having a source terminal coupled to a voltage source, a drain terminal coupled to said first input of said sense amplifier, and a gate terminal coupled to a node;

a fourth pass transistor having a source terminal coupled to said voltage source, a drain terminal coupled to the second input of the sense amplifier, and a gate terminal coupled to the gate terminal of the third pass transistor through the node; and a fifth pass transistor having a source terminal coupled to the drain terminal of the fourth pass transistor, a drain terminal coupled to the drain terminal of the third transistor, and a gate terminal coupled to the gate of the third pass transistor and the fourth pass transistor through said node.

16. A method of making a circuit for sensing signals comprising:

coupling a first pre-charge module between a first core block and a first multiplexer;

coupling a second pre-charge module between a second core block and a second multiplexer;

coupling a first pass transistor coupled between the first multiplexer and a first input of a sense amplifier;

coupling a second pass transistor between the second multiplexer and a second input of the sense amplifier;

coupling a third pre-charge module to the first and second inputs of the sense amplifier; and coupling an output module to the sense amplifier;

the sense amplifier to receive signals through the first and second pass transistors.

17. The method of claim 16, wherein the first pre-charge module comprises at least one NMOS transistor.

18. The method of claim 16, wherein the first pass transistor comprises a PMOS transistor.

19. The method of claim 16, wherein the third pre-charge module comprises:

a third pass transistor having a source terminal coupled to a voltage source, a drain terminal coupled to the first input of the sense amplifier, and a gate terminal coupled to a node;

a fourth pass transistor having a source terminal coupled to the voltage source, a drain terminal coupled to the second input of the sense amplifier, and a gate terminal coupled to the gate terminal of the third pass transistor through the node; and a fifth pass transistor having a source terminal coupled to the drain terminal of the fourth pass transistor, a drain terminal coupled to the drain terminal of the third transistor, and a gate terminal coupled to the gate of the third pass transistor and the fourth pass transistor through the node.

* * * * *